(12) United States Patent
Jung et al.

(10) Patent No.: US 10,361,339 B2
(45) Date of Patent: Jul. 23, 2019

(54) LIGHT EMITTING DEVICE AND MANUFACTURING METHOD THEREFOR

(71) Applicant: SEOUL VIOSYS CO., LTD., Gyeonggi-do (KR)

(72) Inventors: Jung Whan Jung, Ansan-si (KR); Kyung Hae Kim, Ansan-si (KR); Woo Chul Kwak, Ansan-si (KR); Sam Seok Jang, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 7 days.

(21) Appl. No.: 15/526,724

(22) PCT Filed: Nov. 12, 2015

(86) PCT No.: PCT/KR2015/012161
§ 371 (c)(1),
(2) Date: Aug. 14, 2017

(87) PCT Pub. No.: WO2016/076639
PCT Pub. Date: May 19, 2016

(65) Prior Publication Data
US 2018/0047871 A1    Feb. 15, 2018

(30) Foreign Application Priority Data

Nov. 12, 2014    (KR) .................. 10-2014-0156840

(51) Int. Cl.
*H01L 33/00*      (2010.01)
*H01L 33/12*      (2010.01)
(Continued)

(52) U.S. Cl.
CPC ............ *H01L 33/12* (2013.01); *H01L 33/007* (2013.01); *H01L 33/06* (2013.01); *H01L 33/20* (2013.01); *H01L 33/22* (2013.01); *H01L 33/32* (2013.01)

(58) Field of Classification Search
CPC .................................................. H01L 21/0254
See application file for complete search history.

(56) References Cited

U.S. PATENT DOCUMENTS 7,009,215 B2 *   3/2006   D'Evelyn ................. C30B 9/00
                                                     257/100
2006/0046325 A1 *  3/2006   Usui ....................... C23C 16/01
                                                      438/21
(Continued)

FOREIGN PATENT DOCUMENTS

JP     2002280609 A    9/2002
JP     2009049179 A    3/2009
(Continued)

OTHER PUBLICATIONS

International Search Report and Written Opinion for PCT/KR2015/012161, filed Nov. 12, 2015, Applicant: Seoul Viosys Co., Ltd., dated Feb. 25, 2016, ISA/KR, 10 pages.

*Primary Examiner* — Thao P Le
(74) *Attorney, Agent, or Firm* — Perkins Coie LLP (57) ABSTRACT

A light emitting device and a manufacturing method therefor are disclosed. The light emitting device comprises: a patterned sapphire substrate (PSS) including a plurality of concave parts and protruding parts on the upper surface thereof; a buffer layer including a concave part buffer layer, which is positioned on the concave part, and a protruding part buffer layer, which is positioned on the side surface of the protruding part and dispersed and arranged in a plurality of island shapes; a lower nitride layer positioned on the buffer layer and the PSS and covering the protruding part; a void positioned on an interface between the side surface of the protruding part and the lower nitride layer; a first conductive type semiconductor layer positioned on the lower nitride layer; a second conductive type semiconductor layer positioned on the first conductive type semiconductor layer; and an active layer interposed between the first and second conductive type semiconductor layers.

9 Claims, 5 Drawing Sheets

(51) Int. Cl.
*H01L 33/06* (2010.01)
*H01L 33/20* (2010.01)
*H01L 33/22* (2010.01)
*H01L 33/32* (2010.01)

(56) References Cited

U.S. PATENT DOCUMENTS

| | | | | |
|---|---|---|---|---|
| 2007/0040162 A1* | 2/2007 | Song | ................ | H01L 33/42 |
| | | | | 257/13 |
| 2009/0032835 A1* | 2/2009 | Park | ................ | H01L 33/0079 |
| | | | | 257/103 |
| 2010/0102353 A1* | 4/2010 | Park | ................ | H01L 33/32 |
| | | | | 257/98 |
| 2010/0189148 A1* | 7/2010 | Kyono | ................ | B82Y 20/00 |
| | | | | 372/45.01 |
| 2011/0001158 A1* | 1/2011 | Kim | ................ | H01L 21/0242 |
| | | | | 257/98 |
| 2014/0077219 A1* | 3/2014 | Kamiya | ................ | H01L 33/007 |
| | | | | 257/76 |
| 2017/0186905 A1* | 6/2017 | Shur | ................ | C25D 11/045 |

FOREIGN PATENT DOCUMENTS

| | | |
|---|---|---|
| JP | 2013214686 A | 10/2013 |
| KR | 1020080022684 A | 3/2008 |
| KR | 1020110023166 A | 3/2011 |

\* cited by examiner

| Al ratio | 4% | 2% | 1% | <0.5% |
|---|---|---|---|---|
| Vacancy size | 100~300nm | 80~250nm | 50~100nm | <50nm |
| TEM image | | | | |

US 10,361,339 B2

LIGHT EMITTING DEVICE AND MANUFACTURING METHOD THEREFOR

PRIORITY CLAIMS AND CROSS-REFERENCE TO RELATED APPLICATION

This application is the National Stage Entry of International Patent Application No. PCT/KR2015/012161 filed on Nov. 12, 2015, and claims priority from and the benefit of Korean Patent Application 10-2014-0156840, filed on Nov. 12, 2014, each of which are incorporated by reference for all purposes as if fully set forth herein.

TECHNICAL FIELD

Exemplary embodiments of the present disclosure relate to a light emitting device and a method of manufacturing the same, and more particularly, to a light emitting device having good crystallinity and high luminous efficacy and a method of manufacturing the same.

BACKGROUND

A light emitting diode refers to an inorganic semiconductor device that emits light through recombination of electrons and holes, and has recently been used in various fields including displays, automobile lamps, general lighting, and the like. In particular, a nitride semiconductor such as gallium nitride, aluminum nitride, and the like has direct transition characteristics and can be manufactured to have an energy bandgap in various bands, thereby allowing manufacture of light emitting diodes configured to emit light in various wavelength bands, as needed.

A light emitting diode including a nitride semiconductor is manufactured through growth on a homogeneous substrate or a heterogeneous substrate. Since the homogeneous substrate is expensive and difficult to form in a large area, a heterogeneous substrate such as a sapphire substrate is generally used as a growth substrate for nitride semiconductors.

Recently, a patterned sapphire substrate (PSS) having a plurality of protrusions arranged on a growth plane thereof is broadly used. Light emitted from a light emitting diode formed through growth of the PSS can be scattered due to the protrusions on the surface of the sapphire substrate. Thus, the light emitting diode using the PSS can provide higher light extraction efficiency than a light emitting diode using a general sapphire substrate, thereby providing relatively high external quantum efficiency.

SUMMARY

Exemplary embodiments of the present disclosure provide a light emitting device manufactured by a nitride semiconductor growth method which can reduce defect density of a nitride semiconductor grown on a patterned sapphire substrate (PSS) to prevent concentration of defects on the nitride semiconductor grown thereon.

Exemplary embodiments of the present disclosure provide a light emitting device which is manufactured by the nitride semiconductor growth method and has low defect density and high luminous efficacy.

In accordance with one aspect of the present disclosure, a light emitting device includes: a patterned sapphire substrate (PSS) having a plurality of depressions and protrusions formed on an upper surface thereof; a buffer layer including a depression buffer layer disposed on the depressions and a protrusion buffer layer disposed on side surfaces of the protrusions and dispersed in the form of plural islands; a lower nitride layer disposed on the buffer layer and the PSS and covering the protrusions; vacancies formed at interfaces between the side surfaces of the protrusions and the lower nitride layer; a first conductive type semiconductor layer disposed on the lower nitride layer; a second conductive type semiconductor layer disposed on the first conductive type semiconductor layer; and an active layer interposed between the first and second conductive type semiconductor layers.

The buffer layer may include AlGaN.

AlGaN of the buffer layer may have an Al ratio of higher than 0 to 4% or less.

The vacancies may be disposed near the protrusion buffer layer dispersed in the form of plural islands.

The lower nitride layer may include: a rough layer formed using the depression buffer layer as a seed; and a recovery layer disposed on the rough layer.

The lower nitride layer may include an undoped nitride layer.

The vacancies may have a size of 50 nm to 300 nm.

In accordance with another aspect of the present disclosure, a method of manufacturing a light emitting device includes: preparing a patterned sapphire substrate (PSS) including a plurality of depressions and protrusions on an upper surface thereof; forming a buffer layer on the PSS, the buffer layer including a depression buffer layer formed on upper surfaces of the depressions and a protrusion buffer layer formed on at least part of side surfaces of the protrusions; forming a lower nitride layer on the buffer layer to cover the protrusions; and forming a light emitting structure including a first conductive type semiconductor layer disposed on the lower nitride layer, a second conductive type semiconductor layer disposed on the first conductive type semiconductor layer, and an active layer interposed between the first second conductive type semiconductor layers, wherein the buffer layer is grown at a temperature of 600° C. or less and forming the lower nitride layer includes forming vacancies disposed at interfaces between side surfaces of the protrusions and the lower nitride layer.

The buffer layer may include AlGaN.

Growth of the lower nitride layer may include: growing a rough layer using the depression buffer layer as a seed under 3D growth conditions in which vertical growth is predominant to lateral growth; and growing a recovery layer on the rough layer under 2D growth conditions in which lateral growth is predominant to vertical growth.

The rough layer may be formed by growing a plurality of islands surrounding the protrusions and merging the plurality of islands.

Exemplary embodiments of the present disclosure provide a semiconductor light emitting device that is manufactured to have good crystallinity and improved luminous efficacy while effectively preventing current leakage and electrostatic discharge through the nitride semiconductor growth method described above.

BRIEF DESCRIPTION OF DRAWINGS

FIG. 2A to FIG. 6 are sectional views and an enlarged sectional view illustrating a light emitting device according to exemplary embodiments of the present disclosure and a method of manufacturing the same.

DETAILED DESCRIPTION

Figure 1A:
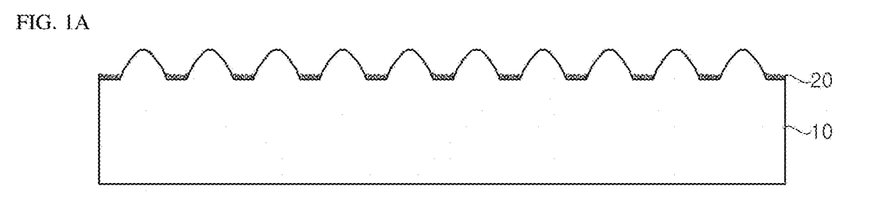
FIGS. 1A and 1B are sectional views and a transmission electron micrograph (TEM) of a nitride semiconductor layer grown on a PSS by a general nitride semiconductor growth method.
Figure 1B:
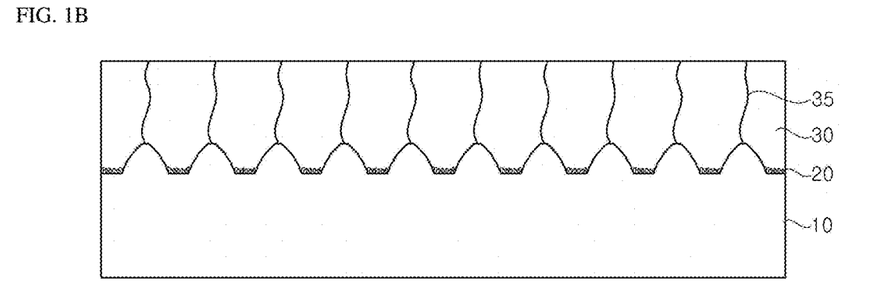

FIGS. 1A and 1B are sectional views and a transmission electron micrograph (TEM) of a nitride semiconductor layer grown on a PSS by a general nitride semiconductor growth method.

Figure 1C:
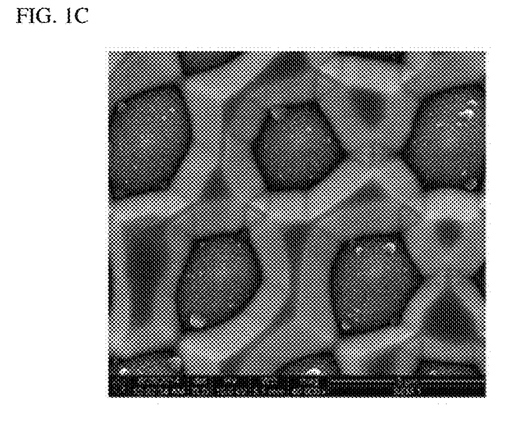

Referring to FIG. 1A, a buffer layer 20 is formed on a PSS having a plurality of protrusions formed thereon. The buffer layer 20 is grown at a relatively low temperature (for example, about 550° C.) on the surface of the PSS mainly between the protrusions. Here, the buffer layer 20 is formed on surfaces of depressions disposed between the protrusions of the PSS and is irregularly arranged on the PSS, as shown in FIG. 1C. Then, referring to FIG. 1B, a nitride semiconductor layer 30 is grown on the buffer layer 20 acting as a seed to cover the plurality of protrusions during growth thereof. During growth of the nitride semiconductor layer 30 from the buffer layer 20 around each protrusion, the nitride semiconductor layer 30 surrounding each protrusion merges. Here, during merger of the nitride semiconductor layer 30 grown from the buffer layer 20 formed in an irregular pattern, lattice mismatch occurs and causes defects 35 such as dislocations at distal ends of the protrusions. For example, as shown in FIG. 1C, dislocations are generated from the distal ends of the protrusions and propagate upwards with growth of the nitride semiconductor layer 30.

In order to prevent deterioration in luminous efficacy or current leakage through propagation of such defects 35 to an active layer of a light emitting diode, an intermediate layer can be interleaved into the semiconductor layer. However, since dislocations are created in a high density at the distal ends of the protrusions and cause severe lattice mismatch, it is difficult to effectively block propagation of the dislocations only by interleaving the intermediate layer.

Hereinafter, exemplary embodiments of the present disclosure will be described in detail with reference to the accompanying drawings. It should be understood that the present disclosure is not limited to the following embodiments and may be embodied in different ways, and that the embodiments are provided for complete disclosure and thorough understanding of the present disclosure by those skilled in the art. In addition, it should be understood that the drawings are not to precise scale and can be exaggerated in thickness of lines or size of components for descriptive convenience and clarity only. It should be understood that, when an element such as a layer, film, region or substrate is referred to as being placed "above"/"below" or "on"/"under" another element, it can be directly placed on the other element, or intervening layer(s) may also be present. Further, like components will be denoted by like reference numerals throughout the specification and the accompanying drawings.

In exemplary embodiments of the present disclosure, nitride semiconductors may be grown in a growth chamber, in particular, in a chamber for Metal Organic Chemical Vapor Deposition (MOCVD). Accordingly, growth conditions proposed in the following description may be applied to growth of nitride semiconductors through MOCVD. However, it should be understood that other implementations are also possible and growth of nitride semiconductors through molecular beam epitaxy (MBE), hydride vapor phase epitaxy (HVPE), and the like falls within the scope of the present disclosure.

Figure 8A:
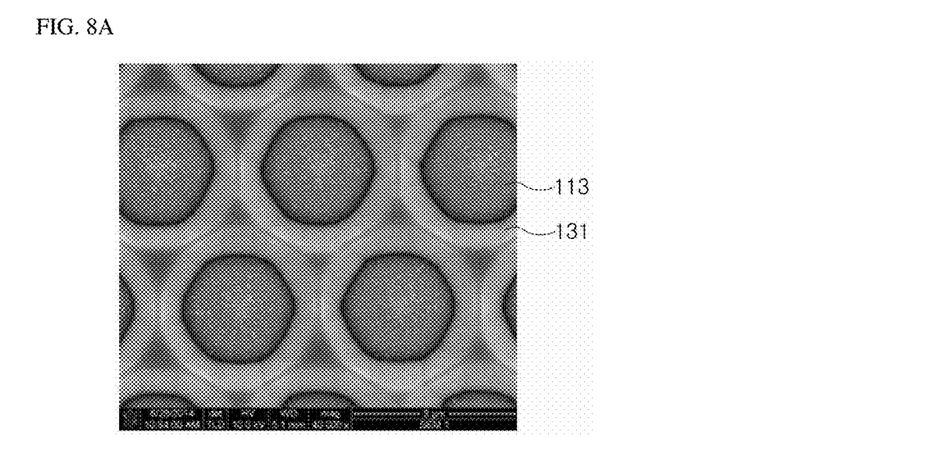
FIG. 8A and FIG. 8B are a scanning electron micrograph (SEM) of a surface of a nitride semiconductor grown according to one exemplary embodiment of the present invention and a TEM of a cross-section thereof.
Figure 8B:
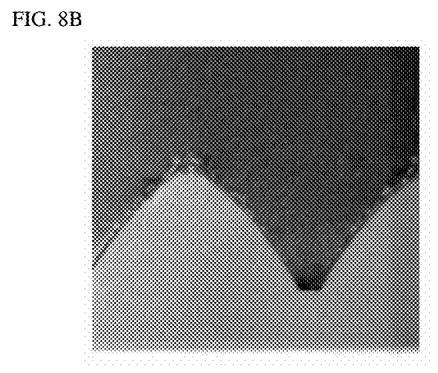
Figure 9:
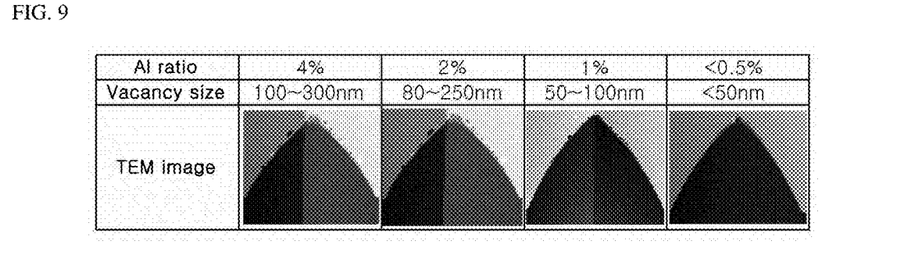
FIG. 9 shows TEMs illustrating size variation of vacancies depending upon Al ratio in an AlGaN buffer layer.

FIG. 2A to FIG. 6 are sectional views and an enlarged sectional view illustrating a light emitting device according to exemplary embodiments of the present disclosure and a method of manufacturing the same. FIG. 8A is a scanning electron micrograph (SEM) of a surface of a buffer layer grown by a growth method according to one exemplary embodiment of the present disclosure and FIG. 8B is a TEM of a cross-section of a nitride semiconductor grown by the growth method according to the exemplary embodiment of the present disclosure. In addition, FIG. 9 shows TEMs illustrating size variation of vacancies depending upon Al ratio in an AlGaN buffer layer.

First, a light emitting device according to exemplary embodiments of the present disclosure and a method of manufacturing the same will be described with reference to FIG. 2A to FIG. 7. FIG. 2B is a partially enlarged sectional view of FIG. 2A and FIG. 3B is a partially enlarged sectional view of FIG. 3A.

Figure 2A:
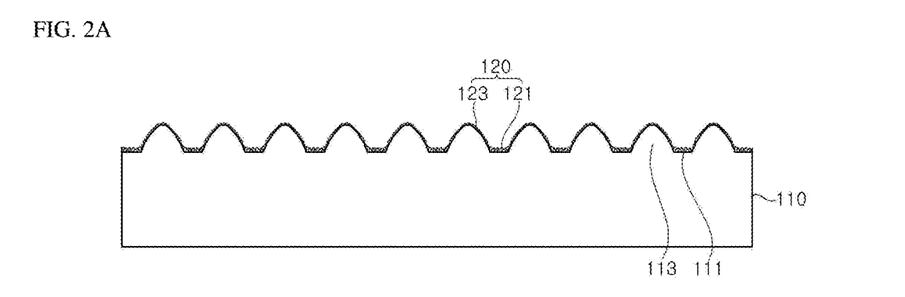
Figure 2B:
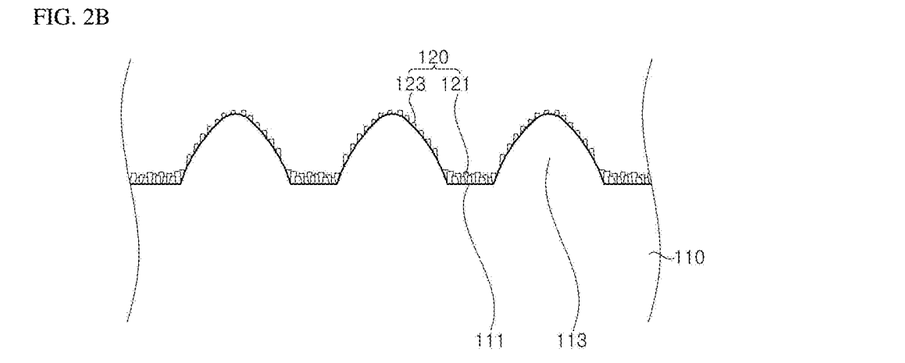

First, referring to FIG. 2A, a patterned sapphire substrate 110 (PSS) is prepared and a buffer layer 120 is formed on the PSS 110.

The PSS 110 may include depressions 111 and protrusions 113 on a growth surface thereof, that is, on an upper surface thereof. The protrusions 113 may be arranged in a certain pattern and/or at regular intervals on the upper surface of the PSS 110 and are not particularly limited to a certain size and arrangement. For example, the protrusions 113 may have a poly-pyramidal shape and a height of about 1.6 μm to 1.7 μm. Particularly, in this exemplary embodiment, the protrusion 113 may be inclined at an acute angle between a side surface thereof and the upper surface of the PSS 110. Accordingly, the buffer layer 120 can be more easily formed on the side surfaces of the protrusions 113.

The buffer layer 120 may include a nitride semiconductor, particularly, AlGaN. As shown in FIG. 2B, the buffer layer 120 may be a polycrystalline layer grown on the PSS 110. However, it should be understood that other implementations are also possible. Further, the buffer layer 120 may be formed on the surfaces of the depressions 111 of the PSS 110 and on at least part of the surfaces of the protrusions 113 of the PSS 110. Accordingly, the buffer layer 120 may include a depression buffer layer 121 formed on the surfaces of the depressions 111 and a protrusion buffer layer 123 formed on part of the surfaces of the protrusions 113.

When the buffer layer 120 includes AlGaN, the buffer layer 120 may be grown at a relatively low temperature, for example, at a temperature of 600° C. or less, specifically at a temperature of 400° C. to 600° C., more specifically at a temperature of 520° C. The buffer layer 120 including AlGaN may be grown by supplying an Al source and a GaN source in a predetermined ratio, for example, in a ratio of about 6:4, into a growth chamber. Here, the buffer layer 120 may be grown, for example, under a pressure of about 500 torr or less, specifically under a pressure of about 400 torr. In the buffer layer 120, AlGaN has an Al ratio of higher than 0 to 4% or less.

The buffer layer 120 including AlGaN exhibits better reactivity than GaN and thus can be grown not only on the upper surfaces of the depressions of the PSS 110, but also on at least part of the side surfaces of the protrusions 113. In this exemplary embodiment, since the buffer layer 120 including AlGaN is grown at a relatively low temperature (about 520° C.), the protrusion buffer layer 123 formed on the side surfaces of the protrusions 113 remains instead of disappearing, unlike the case where the buffer layer 120 is grown at a relatively high temperature.

The protrusion buffer layer 123 formed on the side surfaces of the protrusions 113 may be dispersed in the form of islands separated from each other and irregularly dispersed. Further, the average size (for example, diameter) of the islands of the protrusion buffer layer 123 may depend on the Al ratio of AlGaN. The average size of the islands of the protrusion buffer layer 123 including AlGaN having a relatively small Al ratio may be smaller than that of the protrusion buffer layer 123 having a relatively high Al ratio. For example, the average size of the islands of the protrusion buffer layer 123 including $Al_{0.01}Ga N_{0.99}N$ may be smaller than the average size of the islands of the protrusion buffer layer 123 including $Al_{0.02}Ga N_{0.98}N$.

As such, according to the exemplary embodiment, the buffer layer 123 may be formed on the side surfaces of the protrusions 113. In a subsequent process, when a lower nitride layer 130 is grown from the depression buffer layer 121 formed on the depressions 111 of the PSS 110 to cover the protrusions 113, vacancies can be created at interfaces between the lower nitride layer 130 and the side surfaces of protrusions 113 by the protrusion buffer layer 123 formed on the side surfaces of the protrusions 113. This configuration will be described in detail below.

Figure 3A:
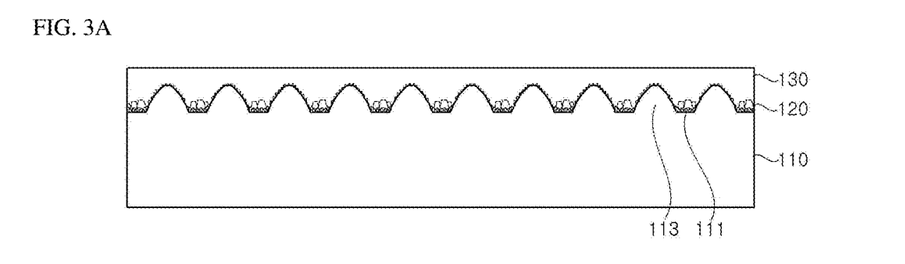
Figure 3B:
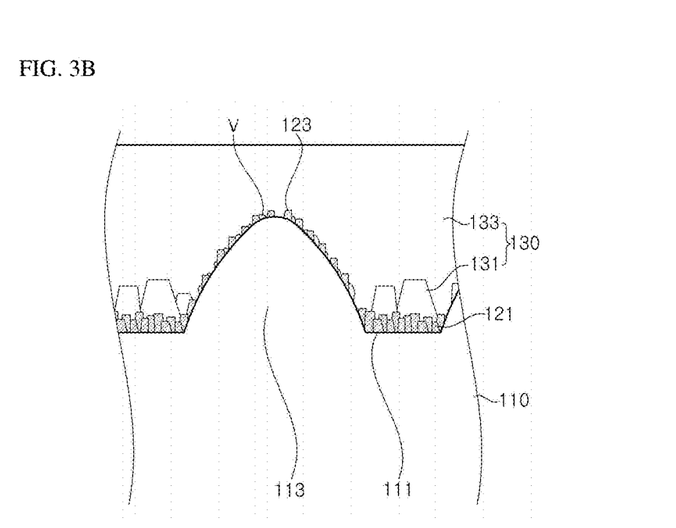

Next, referring to FIG. 3A and FIG. 3B, the lower nitride layer 130 is formed on the buffer layer 120.

The lower nitride layer 130 may be two-dimensionally grown from the buffer layer 120 used as a seed under 2D growth conditions in which lateral growth is predominant to vertical growth. Here, in growth of the lower nitride layer 130, the depression buffer layer 120 formed on the depressions 111 may be used as a seed. The lower nitride layer 130 may include an undoped nitride layer not containing dopants, for example, u-GaN (undoped GaN). The lower nitride layer 130 may be two-dimensionally grown under growth conditions of a higher temperature, a lower pressure and a higher V/III ratio than those of 3D growth conditions. For example, the lower nitride layer 130 may be two-dimensionally grown under growth conditions of about 1,100° C. and about 150 torr in a V/III ratio of about 150.

In addition, growth of the lower nitride layer 130 may include growing a rough layer 131 under the 3D growth conditions in which vertical growth is predominant, followed by growing a recovery layer 133 under the 2D growth conditions in which lateral growth is predominant. The 3D growth conditions can be achieved by providing a lower growth temperature, a higher growth pressure and a lower V/III ratio than those of the 2D growth conditions. For example, as shown in the drawings, the lower nitride layer 130 may be formed by growing the rough layer 131 under the 3D growth conditions at a growth temperature of about 1,030° C., followed by growing the recovery layer 133 from the rough layer 131 under the 2D growth conditions.

The lower nitride layer 130 may be grown to a thickness equal to or higher than the height of the protrusions 113 to cover the protrusions 113. For example, the thickness of the lower nitride layer 130 may be 1 μm to 3 μm greater than the height of the protrusions 113. More specifically, the lower nitride layer 130 may be grown to a thickness of about 3 μm to 5 μm and the rough layer 131 may be grown to a thickness of about 2 μm.

The rough layer 131 and the recovery layer 133 may be grown from the depression buffer layer 121 disposed on the upper surfaces of the depressions 111 of the PSS 110 and acting as a seed therefor, and may not be grown from the protrusion buffer layer 123 disposed on the protrusions 113. In this case, the lower nitride layer 130 grown from the depression buffer layer 121 on the upper surfaces of the depressions 111 merges to cover the protrusions 113. On the other hand, the entirety of the rough layer 131 may be formed in the form of a single crystal, without being limited thereto.

For example, when the buffer layer 120 including AlGaN is used as a seed for growth of the rough layer 131 as in this exemplary embodiment, the rough layer 131 may be regularly formed to surround the protrusions 113, as shown in FIG. 8A. In this case, the rough layer 131 may be grown from the depression buffer layer 121 disposed on the depressions 111 and acting as a seed therefor. As shown in an SEM image, the rough layer 131 may be formed through growth and merger of a plurality of islands surrounding the protrusions 113. Here, the plurality of islands may have substantially the same size. As a result, the degree and density of lattice mismatch occurring during merger of the rough layer 131 grown from the islands on the protrusions 113 can be minimized, thereby improving crystallinity of the lower nitride layer 130. Furthermore, it is possible to achieve significant improvement in crystallinity of other semiconductor layers grown on the lower nitride layer 130 in subsequent processes. Furthermore, when the rough layer 131 is grown from the islands having substantially the same size, a process of merging the lower nitride layer 130 to cover the protrusions 113 can be more easily performed. However, it should be noted that the protrusions 113 of the PSS 110 may be covered by the rough layer 131 depending upon the size thereof.

On the other hand, as the lower nitride layer 130 is formed, vacancies V may be formed at interfaces between the lower nitride layer 130 and the protrusions 113. Particularly, the vacancies V may be formed around the protrusion buffer layer 123 dispersed in the form of islands.

Specifically, during growth of the lower nitride layer 130 from the buffer layer 120, in particular, from the depression buffer layer 121, the lower nitride layer 130 may merge into a single crystal while covering the protrusions 113. Here, the vacancies V can be formed from portions at which the lower nitride layer 130 grown by the protrusion buffer layer 123 arranged in the form of plural islands on the side surfaces of the protrusions does not closely contact the side surfaces of the protrusions 113. Accordingly, the vacancies V may be formed at the interfaces between the lower nitride layer 130 and the protrusions 113 to be adjacent the islands of the protrusion buffer layer 123.

Further, since the vacancies V can be formed through growth of the lower nitride layer 130, with the protrusion buffer layer 123 formed on the side surfaces of the protrusions 113, the size of the vacancies V may depend on the size of the islands of the protrusion buffer layer 123. The average size of the vacancies V may increase with increasing average size of the islands. Accordingly, when the buffer layer 120 includes AlGaN, the size of the vacancies V may increase in proportion to the Al ratio therein. For example, as shown in TEM images of FIG. 9, the size of the vacancies V may increase in proportion to the Al ratio of the buffer layer 120. Accordingly, the size of the vacancies V may be adjusted by adjusting the Al ratio of the buffer layer 120.

The vacancies V may have a size of, for example, 50 nm to 300 nm, without being limited thereto.

The light emitting device manufactured by the method according to this exemplary embodiment may include the vacancies V near the interfaces between the side surfaces of the protrusions 113 of the PSS 110 and the lower nitride layer 130. The vacancies V can improve light extraction efficiency of the light emitting device by scattering and/or reflecting light traveling towards the PSS 110 upon light emission from the light emitting device.

Figure 4:
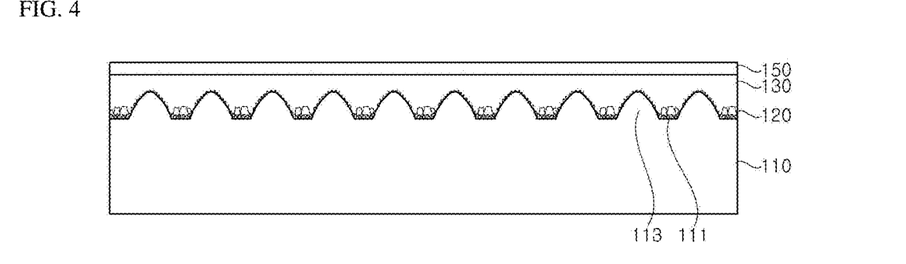

Thereafter, referring to FIG. 4, an intermediate layer 150 may be formed on the lower nitride layer 130. The intermediate layer 150 can prevent dislocations generated during growth of the lower nitride layer 130 from propagating to semiconductor layers grown thereon.

The intermediate layer 150 may be grown on the lower nitride layer 130 and may be a binary or ternary nitride layer including at least one of Al, Ga and In. The intermediate layer 150 may be composed of a single layer or multiple layers and may include a super lattice layer. For example, the intermediate layer 150 may include AlGaN.

Description of details of the intermediate layer 150 known to those skilled in the art will be omitted and the intermediate layer 150 may also be omitted.

Figure 5:
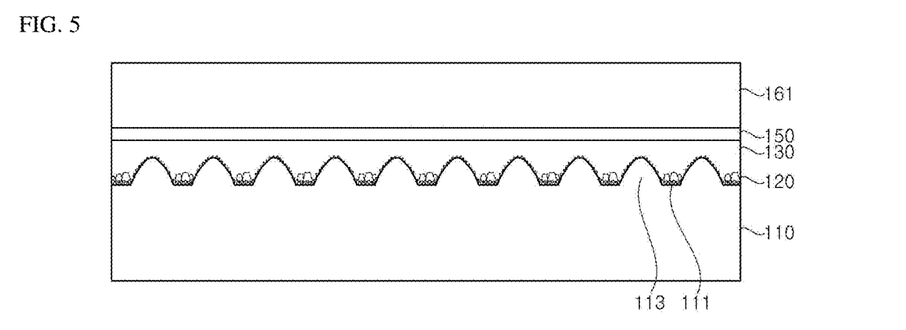

Referring to FIG. 5, a first conductive type semiconductor layer 161 is formed on the lower nitride layer 130.

The first conductive type semiconductor layer 161 may include a nitride semiconductor such as (Al, Ga, In)N and may further include n-type dopants such as Si to exhibit n-type conductivity. The first conductive type semiconductor layer 161 may be grown by introducing a group III element source, a nitrogen source, and an n-type dopant source into the chamber, for example, by introducing a Ga source such as trimethylgallium (TMGa) or triethylgallium (TEGa), an N source such as $NH_3$, and a Si dopant precursor into the chamber. The first conductive type semiconductor layer 161 may include multiple layers, for example, a contact layer and/or a clad layer.

Figure 6:
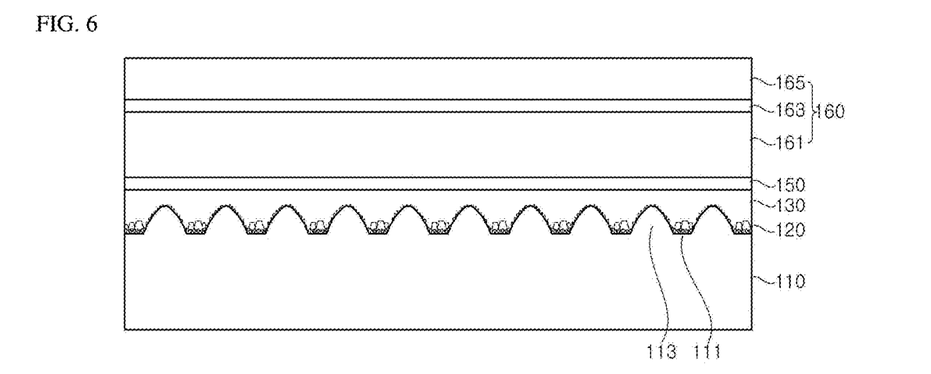

Next, referring to FIG. 6, an active layer 163 and a second conductive type semiconductor layer 165 may be sequentially formed on the first conductive type semiconductor layer 161. Through formation of the second conductive type semiconductor layer 165, a light emitting structure 160 including the first conductive type semiconductor layer 161, the active layer 163 and the second conductive type semiconductor layer 165 can be formed.

The active layer 163 may include a nitride semiconductor such as (Al, Ga, In)N and may be grown on the first conductive type semiconductor layer 161. Further, the active layer 163 may have a multi-quantum well (MQW) structure including pluralities of barrier layers and well layers. Here, elements and composition of the semiconductor layers may be adjusted to allow the semiconductor layers constituting the multi-quantum well structure to emit light having a desired peak wavelength.

The second conductive type semiconductor layer 165 may include a nitride semiconductor such as (Al, Ga, In)N and may be grown on the active layer 163. The second conductive type semiconductor layer 165 may include p-type dopants so as to exhibit p-type conductivity, for example, Mg.

The light emitting device according to this exemplary embodiment may include the light emitting structure 160 grown from the lower nitride layer 130 formed on the buffer layer 120 including AlGaN. As a result, it is possible to provide the light emitting structure 160 that has good crystallinity and exhibits high luminous efficacy through the vacancies V formed around the interfaces between the lower nitride layer 130 and the protrusions 113.

Figure 7:
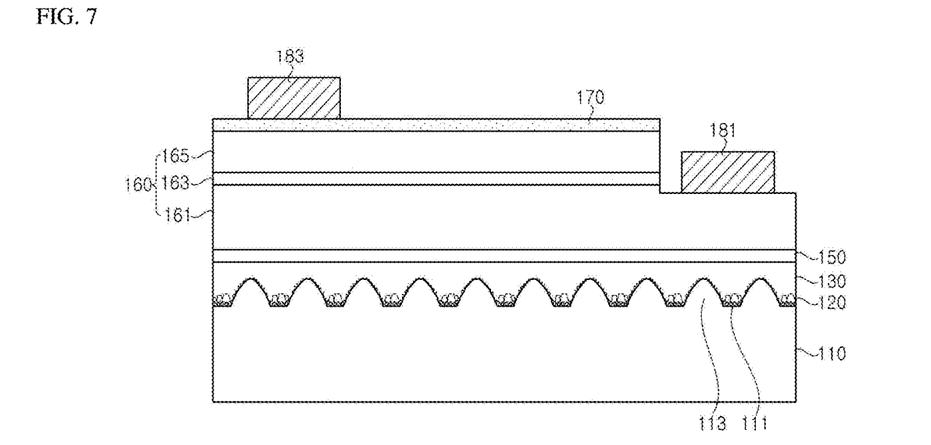
FIG. 7 is a sectional view of a light emitting device according to another exemplary embodiment of the present disclosure.

FIG. 7 is a sectional view of a light emitting device according to another exemplary embodiment of the present disclosure.

The light emitting device of FIG. 7 may be formed from the structure of FIG. 6. The light emitting device of FIG. 7 may be formed by forming a first electrode 181 through partial removal of the light emitting structure 160 of FIG. 6 to partially expose the first conductive type semiconductor layer 161, and forming a transparent electrode 170 and a second electrode 183 on the second conductive type semiconductor layer 165.

Thus, the light emitting device include a PSS 110, a buffer layer 120, a lower nitride layer 130, a light emitting structure 160, the first electrode 181, and the second electrode 183. In addition, the light emitting device may further include an intermediate layer 150 and the transparent electrode 170.

The PSS 110, the buffer layer 120, the lower nitride layer 130, the light emitting structure 160, and the intermediate layer 150 are generally similar to those described with reference to FIG. 2A to FIG. 6, and detailed descriptions thereof will be omitted.

The first electrode 181 may be placed on a partially exposed region of the first conductive type semiconductor layer 161 to be electrically connected to the first conductive type semiconductor layer 161, and the second electrode 183 may be placed on the second conductive type semiconductor layer 165 to be electrically connected to the second conductive type semiconductor layer 165. The first and second electrodes 181, 183 may be electrically connected to an external power source to supply power to the light emitting device.

The transparent electrode 170 may be disposed on the second conductive type semiconductor layer 165 and may be interposed between the second conductive type semiconductor layer 165 and the second electrode 183. The transparent electrode 170 may include a transparent metal stack structure such as Ni/Au, or a transparent conductive oxide, such as ITO or IZO.

In the light emitting device according to the exemplary embodiments, the light emitting structure 160 has low defect density and exhibits good crystallinity. Accordingly, it is possible to provide a light emitting device that minimizes failure of elements due to current leakage and electrostatic discharge. In addition, the vacancies V can be created near the interfaces between the lower nitride layer 130 and the protrusions 113 by the protrusion buffer layer 123 formed on the side surfaces of the protrusions 113. Such vacancies can act to scatter and reflect light upon light emission of the light emitting device, thereby improving light extraction efficiency of the light emitting device.

On the other hand, although the above exemplary embodiments are described with reference to a semiconductor light emitting device such as a lateral type light emitting diode, it should be understood that other implementations are also possible. Implementations of the present disclosure may also be applied to semiconductor light emitting devices having various structures such as vertical type and flip-chip semiconductor light emitting devices.

Although some exemplary embodiments have been described herein, it should be understood that various modifications, changes, alterations, and equivalent embodiments can be made by those skilled in the art without departing from the spirit and scope of the present disclosure.

What is claimed:

1. A light emitting device comprising:
a patterned sapphire substrate (PSS) having a plurality of depressions and protrusions formed on an upper surface thereof;
a buffer layer comprising a depression buffer layer disposed on the depressions and a protrusion buffer layer disposed on side surfaces of the protrusions and dispersed in the form of plural islands, the protrusion buffer layer including a nitride semiconductor including Aluminum (Al);
a lower nitride layer disposed on the buffer layer and the PSS and covering the protrusions;
vacancies formed at interfaces between the side surfaces of the protrusions and the lower nitride layer, the lower nitride layer including an undoped nitride layer;
a first conductive type semiconductor layer disposed on the lower nitride layer;
a second conductive type semiconductor layer disposed on the first conductive type semiconductor layer; and
an active layer interposed between the first and second conductive type semiconductor layers.

2. The light emitting device according to claim 1, wherein the buffer layer comprises AlGaN.

3. The light emitting device according to claim 2, wherein AlGaN of the buffer layer has an Al ratio of higher than 0 to 4% or less.

4. The light emitting device according to claim 1, wherein the vacancies are disposed near the protrusion buffer layer dispersed in the form of plural islands.

5. The light emitting device according to claim 1, wherein the lower nitride layer comprises a rough layer formed using the depression buffer layer as a seed; and a recovery layer disposed on the rough layer.

6. The light emitting device according to claim 1, wherein the vacancies have a size of 50 nm to 300 nm.

7. The light emitting device according to claim 1, wherein the protrusions have a poly-pyramidal shape and a height from 1.6 μm to 1.7 μm.

8. The light emitting device according to claim 1, wherein the buffer layer and the lower nitride layer have different crystal structures from each other.

9. The light emitting device according to claim 1, wherein the buffer layer includes a polycrystalline layer and the lower nitride layer includes a single crystal layer.

* * * * *